United States Patent [19]

Carter

[11] 4,090,140
[45] May 16, 1978

[54] CONSTANT CURRENT CHARGING CIRCUITS FOR HIGH ENERGY MODULATORS

[75] Inventor: John L. Carter, Ocean, N.J.

[73] Assignee: The United States of America as represented by the Secretary of the Army, Washington, D.C.

[21] Appl. No.: 759,684

[22] Filed: Jan. 17, 1977

[51] Int. Cl.² .......................... H03K 1/00; H03K 3/04
[52] U.S. Cl. ........................................ 328/65; 328/67; 328/84
[58] Field of Search ............................. 328/65, 67, 84

[56] References Cited

U.S. PATENT DOCUMENTS

| | | | |
|---|---|---|---|
| 3,051,906 | 8/1962 | Haynes | 328/65 |
| 3,768,038 | 10/1973 | Anzai et al. | 328/65 |
| 3,772,601 | 11/1973 | Smith | 328/65 |

Primary Examiner—Stanley D. Miller, Jr.
Assistant Examiner—B. P. Davis
Attorney, Agent, or Firm—Nathan Edelberg; Edward Goldberg; Sheldon Kanars

[57] ABSTRACT

Means for achieving square wave charging of pulse forming networks in line type pulsers which include parallel pulse forming networks with charging inductors connected between the PFNs. The cumulative value of the distributed inductance of the charging inductors is chosen so that when combined with the total capacitance of the PFNs, the charging network pulsewidth equals the interpulse period.

9 Claims, 9 Drawing Figures

CONSTANT CURRENT CHARGING CIRCUITS FOR HIGH ENERGY MODULATORS

The invention described herein may be manufactured and used by or for the Government for governmental purposes without the payment of any royalties thereon or therefor.

BACKGROUND OF THE INVENTION

1. Field of the Invention The present invention relates to pulse generators and more particularly to such generators employing pulse shaping energy storage networks of the transmission line type capable of producing time spaced pulses by the periodic charging and discharging of the energy storage networks.

2. Description of the Prior Art

In the design of power conditioning apparatus of the pulser type for high energy systems operating for short term duration, the interface between the prime power and the load requires careful consideration. In the majority of cases, the power source comprises a DC source such as a battery or conventional alternator with a rectified output. The considerations of transient operation of the prime power source and the allowable peak values of voltage and current supplied by the prime power source has profound effects on the design of the prime power source. For the case of an alternator feeding into a rectifier coupled to a pulse forming network of the resonant charging type, the fact that the current on the DC side of the rectifier is time variable adds not only additional transients and heat loading of the alternator but also generates mechanical stress problems because the torque loading of the generator varies with the output power. In the case of a battery prime power source, resonant charging of a pulse forming network leads to the requirement for a battery source with larger peak values of voltage and current than would normally be required to supply the same average power into a constant load.

The following references are typical examples of periodic high voltage pulse generating circuits: U.S. Pat. Nos. 2,394,389, H. W. Lord, Feb. 5, 1946; 2,433,379, M. M. Levy, et al., Dec. 30, 1947; 2,461,321, E. A. Guillemin, Feb. 8, 1949; 2,542,066, A. A. Varela, Feb. 20, 1951; 2,656,514, J. R. Perkins, et al., Oct. 20, 1953; 2,837,638, F. W. Frink, June 3, 1958; 3,185,928, M. J. Coyle, May 25, 1965; and 3,590,279, Bobby J. Thompson, et al, June 29, 1971.

SUMMARY

As opposed to resonant charging circuits, the present invention is directed to a constant current (square wave) charging circuit for pulse forming networks in line type pulsers in order to reduce the peak current demand and comprises a plurality of parallely connected pulse forming networks with charging inductors connected between each of the pulse forming networks, with the total inductance value of the charging inductors being chosen so that when combined with the total capacitance of the pulse forming networks, the charging network pulsewidth equals the interpulse period.

DESCRIPTION OF THE PREFERRED EMBODIMENT

Figure 1:
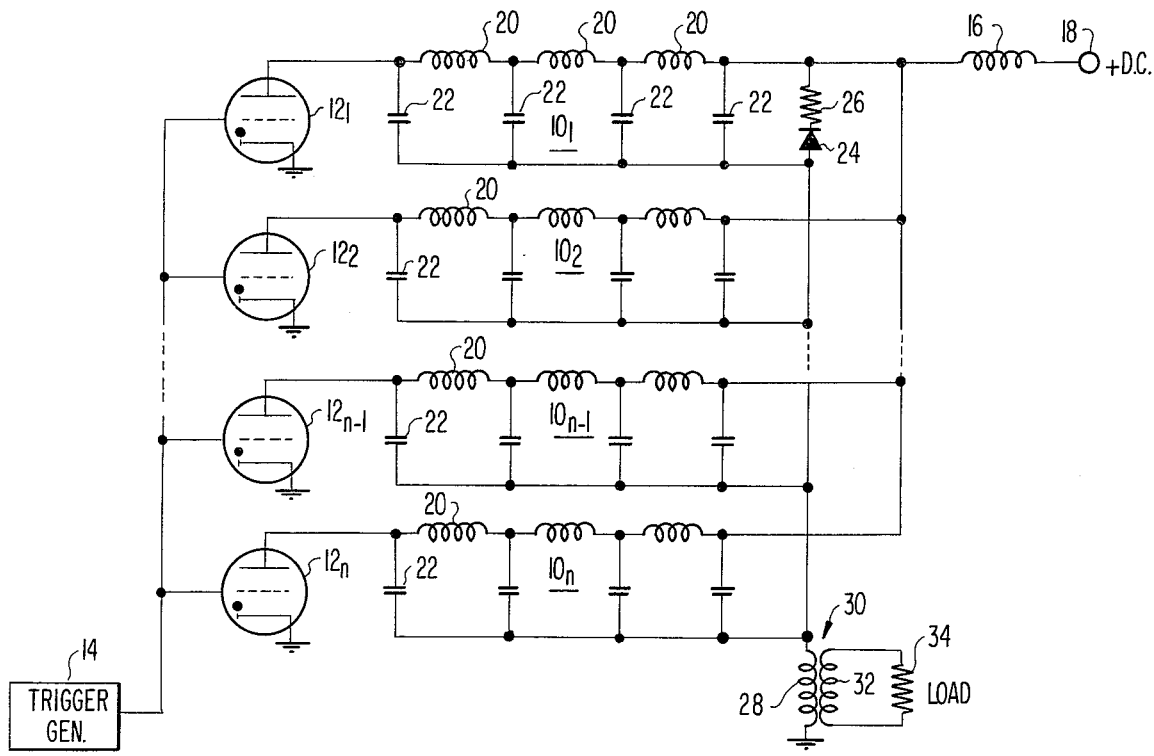
FIG. 1 is an electrical schematic diagram illustrative of a typical prior art resonant charging circuit for parallel pulse forming networks.

A conventional charging circuit for high energy pulsers is shown in FIG. 1. The circuit consists of a plurality of pulse forming networks (PFN) $10_1, 10_2, \ldots 10_{n-1}$ and $10_n$ respectively coupled at one end to a respective switch device shown comprising the thyratrons $12_1, 12_2 \ldots 12_{n-1}$ and $12_n$ whose grid electrodes are commonly coupled to a trigger generator 14. The opposite end of the pulse forming networks $10_1 \ldots 10_n$ is commonly connected to a single charging inductor 16 shown coupled to a terminal 18 which is adapted to be connected to a source of positive DC power supply potential. Each of the pulse forming networks consists of an artificial transmission line or line section comprised of a plurality of series connected inductors 20 and a plurality of parallel connected capacitors 22. An end of line clipper circuit is comprised of a semiconductor diode 24 and a series connected resistor 26 coupled in parallel with the capacitor 22 of the first pulse forming network $10_1$ closest to the charging inductor 16. While one end of the capacitors 22 is coupled to one side of the inductors 20, the opposite ends thereof are commonly connected to the primary winding 28 of a pulse output transformer 30 whose secondary winding 32 is adapted to be connected to a load 34 which may be, for example, a klystron microwave transmission device or a pulsed laser system.

Multiple pulse forming networks $10_1 \ldots 10_n$ are used in order to achieve a low PFN impedance required to match the load 34 through the pulse transformer 30. There is a lower limit, however, to the PFN impedance determined by capacitor inductance and stray inductance. Therefore, the most practical approach is to parallel a plurality of pulse forming networks to achieve the low impedance value. Multiple switches in the form of the thyratrons $12_1 \ldots 12_n$ are utilized in order to maintain the current ratings of switch devices within realistic values. Although gas filled tubes are illustrated, any other type of equivalent switch device may be utilized when desired. The capacitors 22 of each of the pulse forming networks $10_1 \ldots 10_n$ are charged from the +DC potential applied to terminal 18 through the charging inductor 16. The charging inductor 16 is large in comparison to the inductance values of the inductors 20 and is selected to resonate the total capacitance, i.e. the sum of all of the capacitors 22 at the specified pulser repetition rate. The inductance value of the charging inductor 16 is chosen to be significantly larger than the value of the inductors 20, and the total charging inductance of the network is given by the equation:

$$L = T^2/\pi^2 4C \qquad (1)$$

Where L is the charging inductance, T is the charging period and C is the total capacitance of all the pulse forming networks utilized. The charging current for this type of circuit is given by:

$$I = (E/Z_0) \sin \omega t, \quad (2)$$

$$Z_0 = (L/C)^{\frac{1}{2}}, \quad (3)$$

$$\omega = (LC)^{-\frac{1}{2}}, \text{ and} \quad (4)$$

$$E = \text{DC power supply voltage} \quad (5)$$

Figure 4:
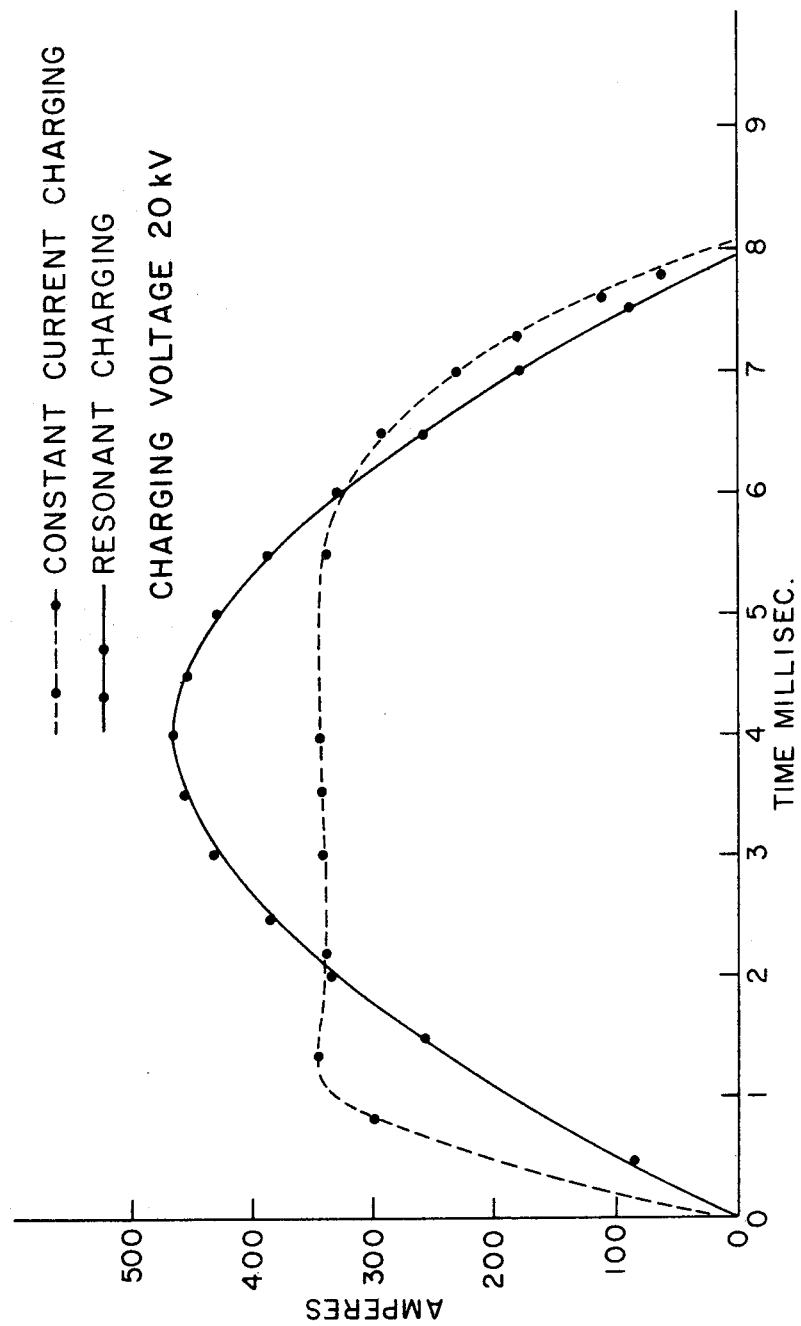
FIG. 4 is a set of curves illustrative of the comparison between resonant charging and constant current charging of a pulse forming network.
Figure 5:
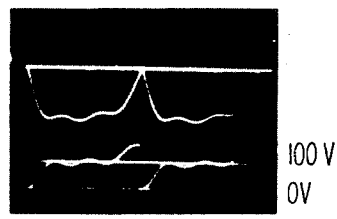
FIGS. 5 through 9 are waveforms illustrative of a constant current charging sequence for a plurality of pulse forming networks operated in parallel in accordance with the teachings of the subject invention.
Figure 8:
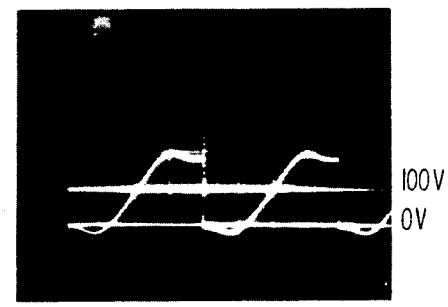
Figure 6:
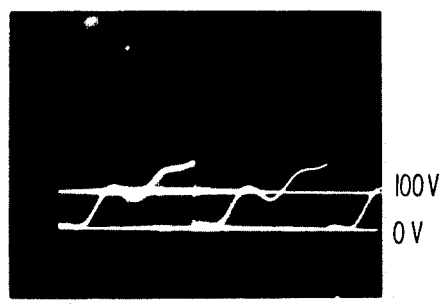

The charging current waveform for this circuit is accordingly a half sine wave such as shown in FIG. 4 with a maximum value of $E/Z_0$ with a period equal to 1/PRF, where PRF is the pulse repetition frequency.

Figure 2:
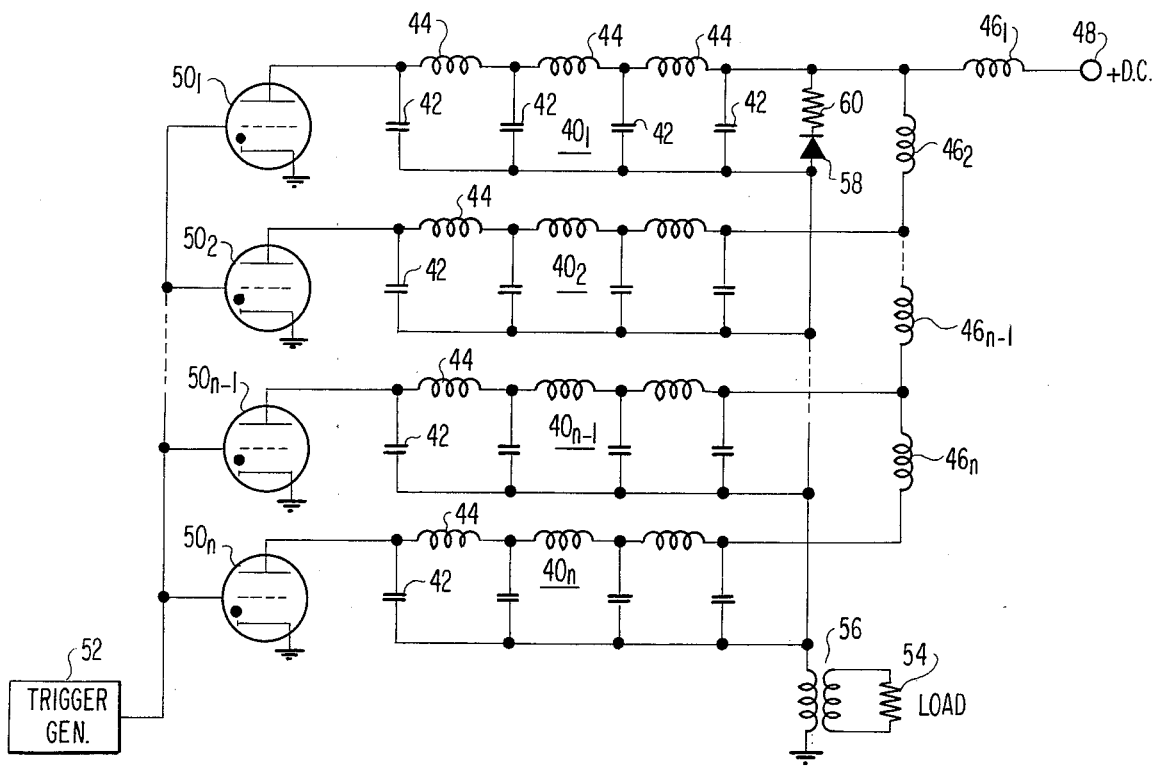
FIG. 2 is an electrical schematic diagram illustrative of a first embodiment of a constant current charging circuit for parallel pulse forming networks according to the subject invention.

Referring now to the subject invention, reference is now made to FIG. 2 where there is disclosed in electrical schematic form the basic embodiment of the subject invention. The circuit shown therein is similar to the resonant charging circuit shown in FIG. 1, but for the single charging inductor 16. In the embodiment shown in FIG. 2, a plurality of pulse forming networks $40_1$, $40_2$, ... $40_{n-1}$ and $40_n$, each comprised of a plurality of paralleled charging capacitors 42 interconnected by means of a plurality of series connected inductors are charged from a DC source by means of a respective plurality of charging inductors $46_1$, $46_2$, $46_{n-1}$ and $46_n$. With a positive DC supply source connected to terminal 48, the first pulse forming network $40_1$ is adapted to be charged through the inductor $46_1$. The second pulse forming network $40_2$ is adapted to be charged by the combination of charging inductors $46_1$ and $46_2$ which appear in series between the pulse forming network and the power supply terminal 48. In a like manner, a next-to-last pulse forming network $40_{n-1}$ is charged through the combined inductors $46_1$, $46_2$ ... $46_{n-1}$. Finally, the last pulse forming network $40_n$ is charged through the total series string of all the charging inductors $46_1$ ... $46_n$.

The inductance of each of the charging inductors $46_1$, $46_2$ ... $46_{n-1}$ and $46_n$ is chosen so that the total inductance taken in combination with the total capacity of the pulse forming networks provides a composite pulse forming network in which constant current charging of the capacitors 42 is achieved such as shown in FIG. 4. The individual inductances 44 are relatively small in comparison with the value of the individual charging inductances $46_1$, $46_2$, etc. and can accordingly be ignored. Each pulse forming network $40_1$, $40_2$ ... $40_{n-1}$ and $40_n$ nevertheless requires its own discharge switch $50_1$, $50_2$ ... $50_n$, which are adapted to be simultaneously driven into conduction by means of a trigger generator 52 and thus deliver a discharge pulse to a load 54 through a pulse transformer 56. A single discharge switch is not used since the pulse forming networks would then have to be connected to a common point which would short out all but the first charging inductor section $40_1$. A single discharge switch, however, can be used if appropriately inserted diodes are included to prevent charging from the switch end of the pulse forming networks.

Where for example the pulse forming networks $40_1$, $40_2$ ... $40_n$ each comprise 25ohm PFNs wherein the combined capacitance of the capacitors 42 is equal to 0.1 microfarads ($\mu$f) and the combined inductance of the inductors 44 is 62.5 microhenries ($\mu$h), for a pulser operating at a pulse discharge repetition frequency of 250Hz which value of frequency corresponds to a charging period of $4 \times 10^{-3}$ seconds, the total inductance required for constant current charging is such that when combined with the total capacitance of the pulse forming networks, the charging network pulsewidth equals the interpulse period. Stated mathematically, $$L = T_2/4C \quad (6)$$

which is calculated to yield an inductance L for the stated conditions of 10 henries(h) which value is selectively distributed between the charging inductors $46_1$, $46_2$ ... $46_{n-1}$ and $46_n$.

Figure 3:
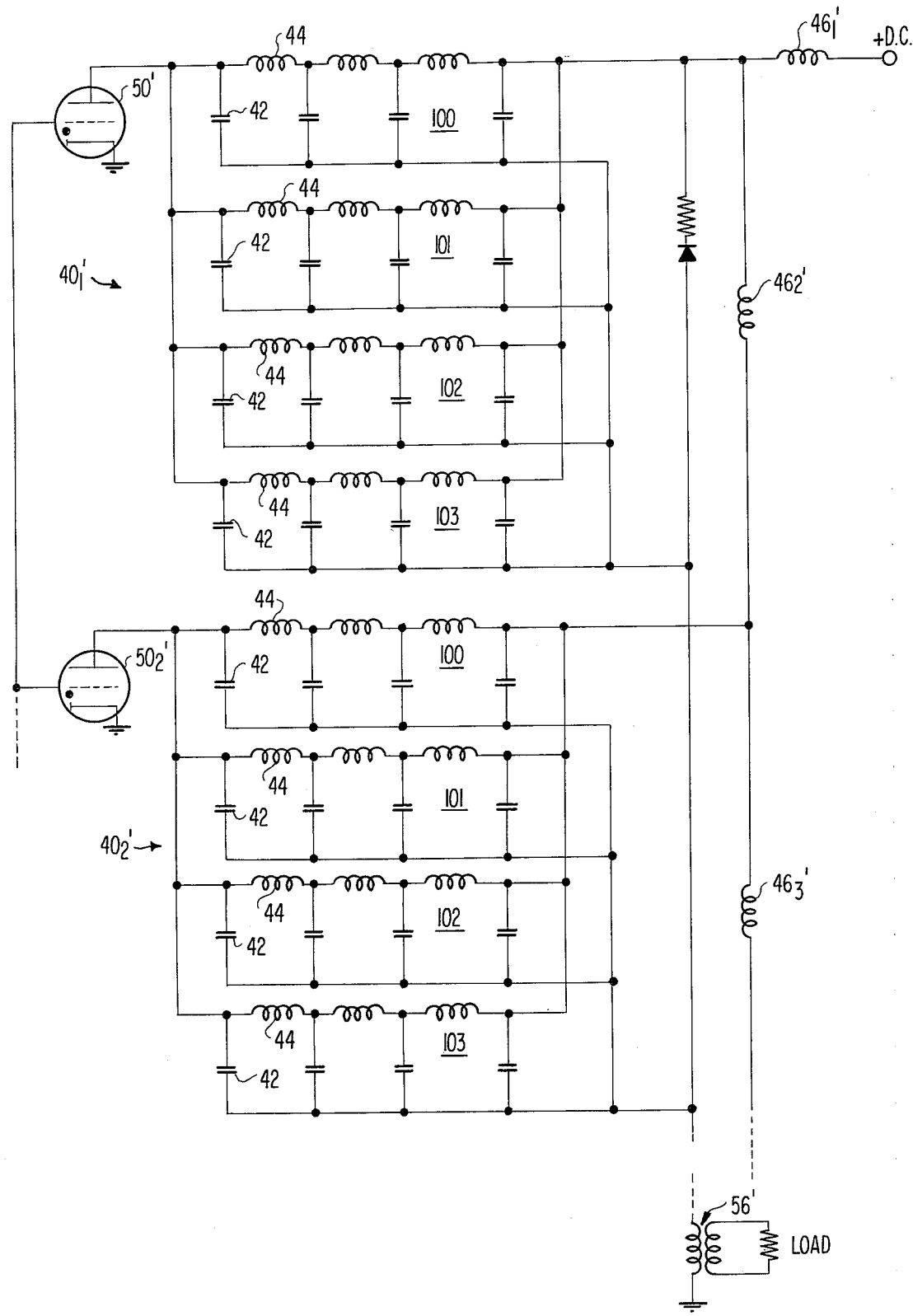
FIG. 3 is an electrical schematic diagram illustrative of a second embodiment of the subject invention.
Figure 9:
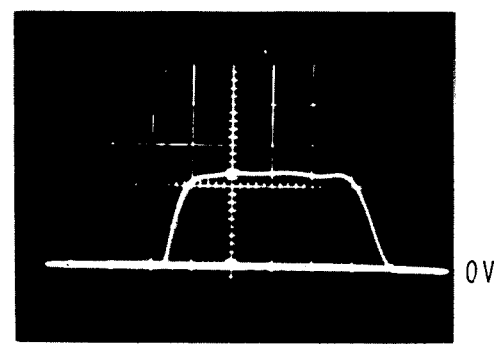
Figure 7:
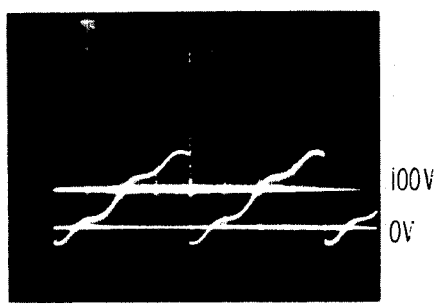

In an actual working embodiment of a four PFN ($n = 4$) system the 10 henry charging inductance value was equally distributed, i.e. inductances $46_1$, $46_2$, etc. each was comprised of a 2.5 henry inductor. Where a +100V DC supply potential was provided, waveforms as exhibited by FIGS. 5 through 9 were observed and recorded. The FIGS. 5, 6, 7 and 8 are illustrative of the charging sequence of the first through fourth pulse forming network, respectively, with FIG. 5 additionally including a waveform at the top portion of the figure indicative of the actual charging current while FIG. 9 is a waveform depicting the actual discharge current through a resistive load, typically 1.3 ohms. It is interesting to note, for example, that the last or fourth pulse forming network (FIG. 8) charges directly to twice the power supply voltage of +200V after a short time delay. The third, second and first pulse forming network (FIGS. 7, 6 and 5, respectively) also tend to charge to twice the power supply potential, but each is correspondingly delayed slightly with respect to the other. This is attributed to the corresponding added charging inductance provided as one progresses from the supply potential end to the load end.

Where for example a relatively high power pulser is desired to excite a laser type load, a configuration as shown in FIG. 3 may be resorted to. There each pulse forming network $40_{1'}$ and $40_{2'}$ is comprised of four pulse forming networks 100, 101, 102 and 103 connected in parallel and where, for example, $n$ is equal to 6, i.e. 6 groups of parallel pulse forming networks are utilized in connection with six respective thyratron switches $50_{1'}$, ... $50_{6'}$. Additionally, in order to provide a better pulse shape of the output pulse applied to the load via the pulse transformer 56', it may be desirable to increase the value of the first and last charging inductor $46_{1'}$ and $46_{6'}$ by a factor of 20 and 15%, respectively, which yields by computer analysis a plot as shown in FIG. 4 where a charging voltage of 20 kilovolts is achieved at operation in the region of 350 amperes as opposed to 450 amperes for resonant charging. It can be seen that the constant current charging circuit draws 35% less current than a resonant charging circuit, as evidenced by curves shown in FIG. 4.

Having thus shown and described what is at present considered to be the preferred embodiments of new and novel means for achieving square wave charging of pulse forming networks in line type pulsers.

I claim:

1. In a pulse generating circuit for supplying pulses to a load and having a plurality of parallel energy storage networks including capacitance means adapted to be charged from a power source through charging inductor means and subsequently discharged through output means coupled to said load and a first storage network connected to said power source through a first charging inductor, the improvement comprising, a second energy storage network, and a second charging inductor connected in series between said second energy storage network and said first charging inductor, said charging inductors providing constant current charging for said energy storage networks and having a cumulative distributed inductance value which when combined with the total capacitance of said energy storage networks provides an output pulse to said load having a pulse-width equal to the interpulse period between consecutive discharges.

2. The pulse generating circuit as defined by claim 1 including a plurality of charging inductors equal in number to the number of said energy storage networks.

3. The pulse generating circuit as defined by claim 2 wherein said plurality of charging inductors are connected in series and respective charging inductors are connected to respective energy storage networks.

4. The pulse generating circuit as defined by claim 3 wherein said plurality of inductors has substantially equal inductance values.

5. The pulse generating circuit as defined by claim 4 wherein said cumulative inductance value is calculated from the equation:

$$L = T^2/4C$$

where T is the charging period, and C is the total capacitance of said energy storage networks.

6. The pulse generating circuit as defined by claim 1 wherein said energy storage networks are comprised of pulse forming networks including a plurality of capacitors coupled in parallel by means of respective inductors.

7. The pulse generating circuit as defined by claim 1 wherein said plurality of energy storage networks each includes a group of parallely connected pulse forming networks, each includes a plurality of capacitors intercoupled in parallel by respective inductors.

8. The pulse generating circuit as defined by claim 1 wherein said charging inductors are connected in series to said power source and wherein the inductance value of the first and last inductor is greater than the inductance values of the intermediate inductors.

9. The pulse generating circuit as defined by claim 8 wherein the inductance value of said first inductor is substantially 20% greater in value than the value of said intermediate inductors, and wherein the inductance value of said last inductor is substantially 15% greater than the value of said intermediate inductors.

* * * * *